(12) United States Patent
Paolella et al.

(10) Patent No.: US 9,190,342 B2
(45) Date of Patent: Nov. 17, 2015

(54) HIGH-POWER ELECTRONIC DEVICES CONTAINING METAL NANOPARTICLE-BASED THERMAL INTERFACE MATERIALS AND RELATED METHODS

(71) Applicant: LOCKHEED MARTIN CORPORATION, Bethesda, MD (US)

(72) Inventors: Arthur Paolella, Melbourne Beach, FL (US); Adam Theron Winter, Windham, NH (US); David S. Degler, Yardley, PA (US); Alfred A. Zinn, Palo Alto, CA (US); Susan Patricia Ermer, Redwood City, CA (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 14/466,938

(22) Filed: Aug. 22, 2014

(65) Prior Publication Data
US 2015/0054020 A1    Feb. 26, 2015

Related U.S. Application Data

(60) Provisional application No. 61/869,609, filed on Aug. 23, 2013.

(51) Int. Cl.
 *H01L 33/00* (2010.01)
 *H01L 23/373* (2006.01)
 *H01L 33/64* (2010.01)
 *H01L 23/42* (2006.01)

(52) U.S. Cl.
 CPC ............ *H01L 23/3736* (2013.01); *H01L 23/42* (2013.01); *H01L 33/641* (2013.01); *H01L 23/373* (2013.01); *H01L 23/3732* (2013.01); *H01L 23/3737* (2013.01); *H01L 2924/0002* (2013.01); *H01L 2933/0075* (2013.01)

(58) Field of Classification Search
 CPC .... H01L 23/373; H01L 23/42; H01L 23/3736
 USPC .......................................................... 257/99
 See application file for complete search history.

(56) References Cited

U.S. PATENT DOCUMENTS 7,736,414 B1    6/2010  Zinn
8,105,414 B2    1/2012  Zinn (Continued)

*Primary Examiner* — Douglas Menz
(74) *Attorney, Agent, or Firm* — McDermott Will & Emery LLP

(57) ABSTRACT

High-power electronic components generate significant amounts of heat that must be removed in the course of normal device operations. Certain types of electronic components, such as some monolithic microwave integrated circuits and LEDs, can contain materials that are difficult to effectively bond to a heat gink in order to establish a thermal interface between the two. Device assemblies can include a heat-generating electronic component in thermal communication with a metallic heat sink via a metallic thermal interface layer. The metallic thermal interface layer is disposed between the heat-generating electronic component and the metallic heat sink. The metallic thermal interface layer is formed from a composition including a plurality of metal nanoparticles that are at least partially fused together with one another. Methods for forming a thermal interface layer include heating metal nanoparticles above their fusion temperature and subsequently cooling the liquefied metal nanoparticles to promote bonding of the electronic component.

20 Claims, 5 Drawing Sheets

(56) References Cited

U.S. PATENT DOCUMENTS

| | | |
|---|---|---|
| 8,192,866 B2 | 6/2012 | Golightly et al. |
| 8,486,305 B2 | 7/2013 | Zinn et al. |
| 8,900,704 B1 * | 12/2014 | Zinn .............................. 428/402 |
| 2011/0215279 A1 | 9/2011 | Zinn |
| 2012/0114521 A1 | 5/2012 | Zinn |
| 2013/0209692 A1 | 8/2013 | Zinn et al. |

* cited by examiner

HIGH-POWER ELECTRONIC DEVICES CONTAINING METAL NANOPARTICLE-BASED THERMAL INTERFACE MATERIALS AND RELATED METHODS

CROSS-REFERENCE TO RELATED APPLICATIONS

This application claims the benefit of priority under 35 U.S.C. §119 from U.S. Provisional Patent Application 61/869,609, filed Aug. 23, 2013, which is incorporated herein by reference in its entirety.

STATEMENT REGARDING FEDERALLY SPONSORED RESEARCH OR DEVELOPMENT

Not applicable.

FIELD

The present disclosure generally relates to nanomaterials, and, more specifically, to thermal interfaces formed from metal nanoparticles and methods for their production.

BACKGROUND

Ineffective thermal communication between a heat source and a heat sink hampers the dissipation of excess heat from a system, and damage to system components can occur with ongoing heat buildup due to poor heat transfer. Thermal interface materials (TIMs) can be used in many instances to form a more robust thermal connection between an abutted heat source and heat sink to promote better heat transfer between the two, ideally by minimizing the occurrence of contact voids that diminish the efficiency of heat transfer.

Thermal greases, thermal epoxies, and certain types of metal solder are commonly used for forming thermal interfaces between various structures. The degree to which the heat source and heat sink are mechanically held together depends upon the chosen thermal interface material, with thermal greases providing only weak mechanical coupling and thermal epoxies and metal solders providing stronger bonding. Further, the choice of a particular thermal interface material for a given application can be dictated by the properties of the structures between which thermal communication is to be established. Accordingly, there is no one thermal interface material suitable for universal use across a wide variety of platforms.

Some heat sources and heat sinks are particularly difficult to effectively thermally couple due to chemical or physical incompatibility between the two. For example, coefficient of thermal expansion (CTE) mismatch between the thermal interface material, the heat source and/or the heat sink can result in delamination of the coupled structures. Similarly, if the surfaces of the heat source and the heat sink are of a significantly different chemical nature, ineffective mechanical coupling via the thermal interface material can occur. When the surfaces of the heat source and the heat sink are chemically or physically incompatible with one another, conventional materials can often be insufficient for forming an effective thermal interface, and rise of more costly and labor-intensive materials can often become necessary.

High-power, high-frequency electronic circuits, such as those operating in the microwave-frequency range, are one example of a heat source that can be difficult to effectively thermally couple to a heat sink. For example, monolithic microwave integrated circuits (MMICs) only utilize about 10-50% of their input power to produce an output signal, and the remaining power is expended as considerable amounts of heat. Traditional substrates for constructing MMICs can include, for example, Si, GaAs, InP and SiGe. MMICs fabricated from such traditional substrates can usually be bonded to a heat sink using thermal epoxies, such as silver epoxy.

Thermally stable substrates such as GaN and SiC, for example, can enable much higher MMIC operating temperatures. Thermal epoxies can only be used for these types of MMICS when they are operating at less than their maximum possible input power, so as to limit the amount of output heat. For the high, operating temperatures characteristic of full or near-full power-operations, thermal epoxies generally possess inadequate temperature stability, and more robust thermal interface materials such, as AuSn solder, for example, are often used for establishing a thermal interface. AuSn solder, however, is expensive, requires laborious application and curing conditions, and is prone to void formation when flowed. High-power light-emitting diodes (LEDs) can present similar issues to those encountered when working with MMICs. Moreover, intermetallic compound formation can take place during processing of AuSn solder, producing brittle phases such as $AuSn_4$, which can lead to mechanical failure during operation due to factors such as vibration/shock and thermal cycling.

FIGS. 1A and 1B show illustrative images of voids 1 that can commonly occur during the use of AuSn solder 2. FIG. 2 shows a corresponding x-ray image of similar voids that can occur when using AuSn solder, demonstrating that the voids extend in both dimensions in the x-y plane. The voids can decrease the degree of thermal communication that takes place through the thermal interface layer.

In addition to the foregoing difficulties, CTE mismatch usually necessitates the use of specialized copper alloy (e.g., W/Cu or Mo/Cu) heat sinks to match the CTE of the high-temperature MMIC in order to decrease the likelihood of delamination. Such copper alloy substrates are prone to formation of a passivating metal oxide surface layer, which can further complicate the working conditions needed to establish an effective thermal interface layer.

The U.S. Government is actively seeking new means through which the challenges associated with MMICs and other high-power electronic devices can be better addressed, particularly the elimination of AuSn solder in their manufacturing. In view of the foregoing, improved thermal interface layers within device assemblies containing high-power electronic components, such as MMICs and LEDs, and methods for their production, are of considerable interest in the art. The present disclosure satisfies the foregoing need and provides related advantages as well.

SUMMARY

In various embodiments, the present disclosure describes device assemblies containing a heat-generating electronic component in thermal communication with a metallic heat sink via a metallic thermal interface layer. The metallic thermal interface layer is disposed between the heat-generating electronic component and the metallic heat sink. The metallic thermal interface layer is formed from a composition containing a plurality of metal nanoparticles that are at least partially fused together with one another.

In various embodiments, methods for forming a thermal interface layer in device assembly include placing a composition containing a plurality of metal nanoparticles between a metallic heat sink and a heat-generating electronic component, heating the composition above a fusion temperature of the metal nanoparticles to liquefy the metal nanoparticles, and cooling the liquefied metal nanoparticles to form a metallic thermal interface between the heat-generating electronic component and the metallic heat sink. The metallic thermal interface layer contains metal nanoparticles that have been at least partially fused together with one another.

The foregoing has outlined rather broadly the features of the present disclosure in order that the detailed description that follows can be better understood. Additional features and advantages of the disclosure will be described hereinafter. These and other advantages and features will become more apparent from the following description.

BRIEF DESCRIPTION OF THE DRAWINGS

For a more complete understanding of the present disclosure, and the advantages thereof, reference is now made to the following descriptions to be taken in conjunction with the accompanying drawings describing specific embodiments of the disclosure, wherein.

DETAILED DESCRIPTION

The present disclosure is directed, in part, to device assemblies containing a metallic thermal interface layer formed from metal nanoparticles that have been at least partially fused together with one another. The present disclosure is also directed, in part, to methods for forming a metallic thermal interface layer in device assemblies, particularly device assemblies containing high-power electronic components operating at high frequencies.

Ineffective heat transfer in high-power electronic components can be extremely problematic. Although various materials can be used to form a thermal interface layer between a heat source and a heat sink, there is no universally applicable material that can be used across a wide variety of platforms. Some electronic components, including monolithic microwave integrated circuits (MMICs) and high power light-emitting diodes (LEDs), for example, are presently only able to be bonded to a heat sink through complex and costly processing techniques. For example, MMICS fabricated on GaN or SiC substrates are presently only attachable to heat sinks using costly AuSn solder and laborious processing conditions. Not only is AuSn solder costly and difficult to work with, but it is prone to void formation and production of brittle intermetallic phases during processing. Similar problems are presented when bonding high-power LEDs to a heat sink.

Less thermally stable materials, such as silver epoxy and other metallic thermal epoxies, can also be used for establishing a thermal interface to various high power electronic components. However, the low thermal stabilities of such epoxies can require operating a device assembly at less than its maximum power in order to keep the resultant temperature low. This represents an inefficient operational condition. Specifically, operating at less than the maximum possible power reduces the device assembly power density per unit area, which can require adding further electronic components to compensate For the decreased operational functionality. Adding further electronic components undesirably increases the cost, weight and size of the device assemblies.

Figure 1A:
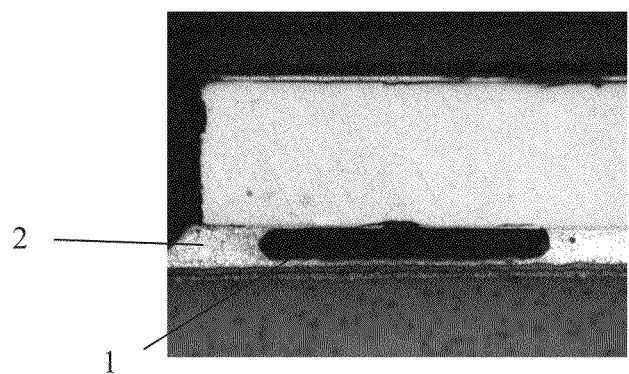
FIGS. 1A and 1B show illustrative images of voids that can commonly occur during the use of AuSn solder.
Figure 1B:
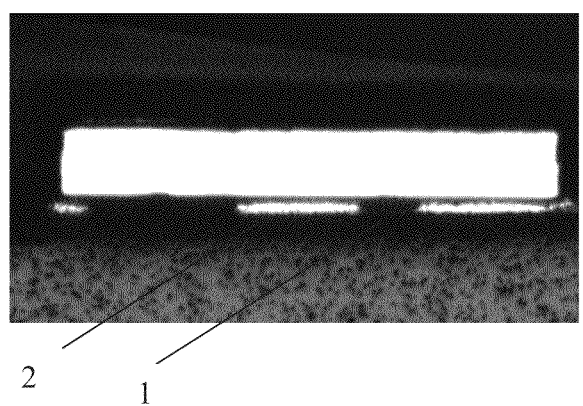
Figure 2:
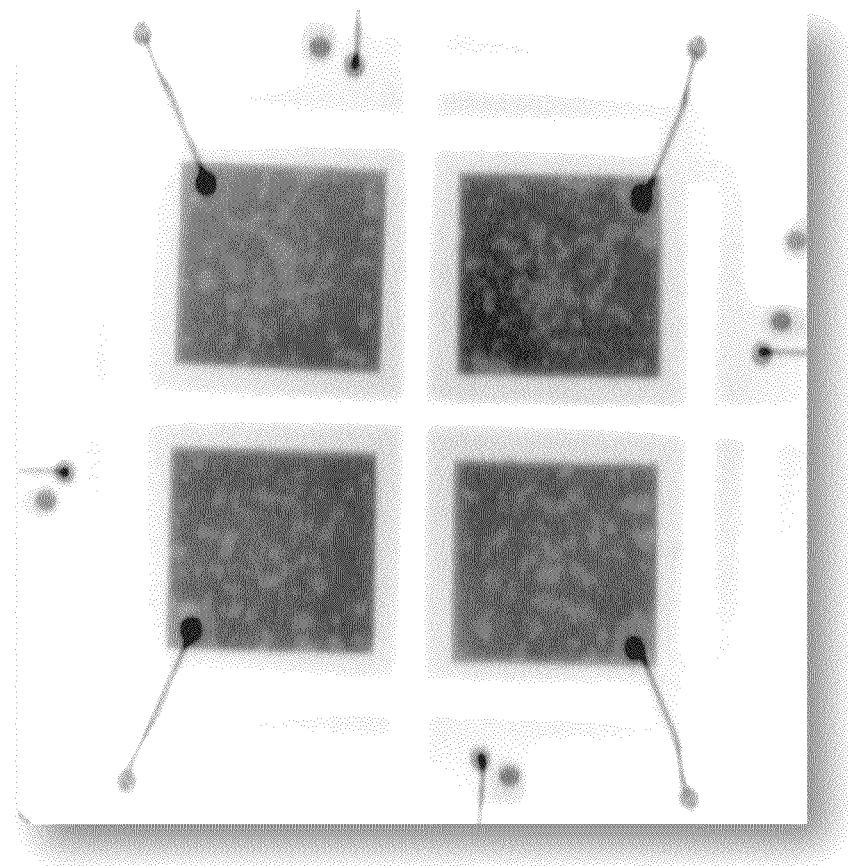
FIG. 2 shows a corresponding x-ray image of similar voids that can occur when using AuSn solder, demonstrating that the voids extend in both dimensions in the x-y plane.
Figure 3:
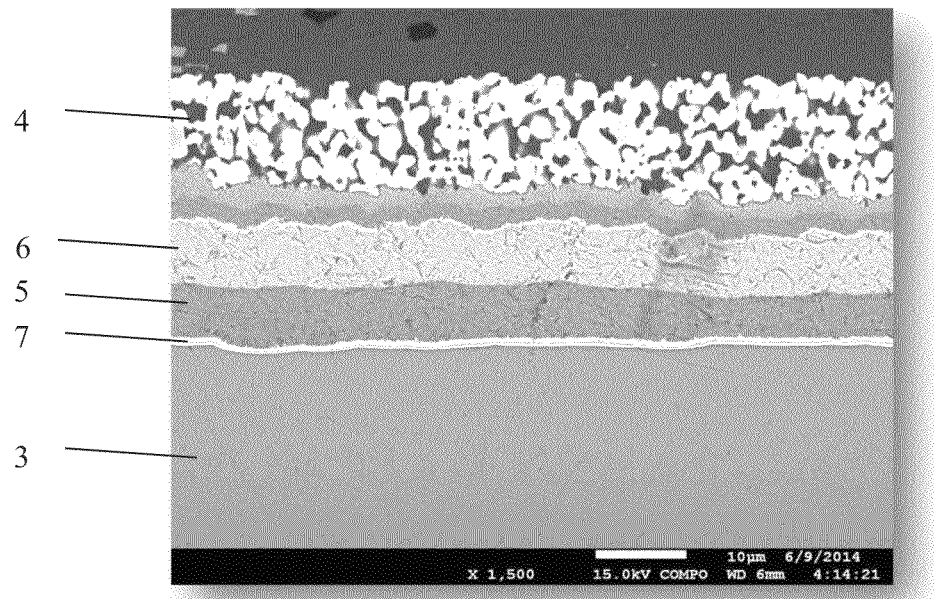
FIG. 3 shows an illustrative image of an LED joined to a heat sink via a layer formed from copper nanoparticles, which is disposed between a silver contact and a gold contact.
Figure 4:
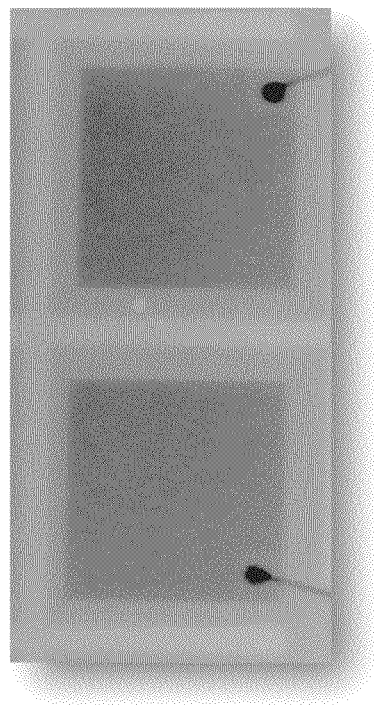
FIG. 4 shows a corresponding x-ray image of the thermal interface formed from copper nanoparticles in FIG. 3, again demonstrating the substantial lack of voids in the x-y plane.

In response to the foregoing issues, the present inventors discovered that metal nanoparticles, especially copper nanoparticles can be readily used to establish a thermal interface layer between high-power electronic components and a heat sink. Thermal interface layers formed from metal nanoparticles are metallic and have high thermal conductivity values that approach those of the corresponding bulk metal. Advantageously, compositions containing metal nanoparticles can be applied using facile application techniques, comparable to those used for applying thermal epoxies, but without encountering the thermal stability issues associated with the latter types of materials. Metal nanoparticles are also much more readily processed than are metal solders, while still retaining their thermal stability when fabricated into a thermal interface layer. Specifically, metal nanoparticles avoid the void generation and containment problems that can be prevalent when flowing metal solders, such as AuSn solder. For example, FIG. 3 shows an illustrative image of an LED 3 joined to a heat sink 4 via a layer 5 formed from copper nanoparticles, which is disposed between silver contact 6 and gold contact 7. As can be seen, there are substantially no voids present. FIG. 4 shows a corresponding x-ray image of the thermal interface formed from copper nanoparticles in FIG. 3, again demonstrating the substantial lack of voids in the x-y plane.

Metal nanoparticles can be particularly advantageous for use in conjunction with high-power electronic devices operating at high frequencies, such as MMICs. In the specific instance of GaN- or SiC-based MMICs, for example, the inventors recognized that compositions containing copper nanoparticles can provide for particularly efficient bonding between the MMIC and the surface of a heat sink. For these types of MMICs, copper alloys are often used within the heat sink to match the coefficient of thermal expansion of GaN or SiC, and a copper surface layer is often, present on the MMIC. Hence, a copper-based thermal interface layer can provide minimal CTE mismatch and good material compatibility between the MMIC and its heat sink. As discussed below, various additives can also be included with the copper nanoparticles to further enhance the thermal conductivity values and/or tailor the CTE to a particular value. Metal nanoparticles can provide similar benefits when used in conjunction with high-power LEDs.

High-power electronic devices operating at low frequencies often utilize QFN (quad-flat, no leads) packaging configurations in their design, even when using AuSn solder for their attachment to a heat sink. In contrast, high-frequency applications, such as those utilizing MMICs, are usually not able to employ QFN packaging configurations due to unacceptable internal inductance resulting from the AuSn solder application. Advantageously, metal nanoparticles lessen the likelihood of internal inductance in a device assembly, since they largely avoid the processing difficulties of AuSn solder that ultimately lead to inductance. Accordingly, the use of metal nanoparticles better enables the implementation of MMICs in QFN packaging configurations, resulting in improved assembly tolerances during fabrication and decreased manufacturing costs.

When used in conjunction with LEDs, metal nanoparticles can provide for more efficient thermal transfer from the LEDs, which can increase their lifetime. Moreover, more efficient thermal transfer can increase the lumen output of the LEDs.

The inventors also discovered that metal nanoparticle compositions can desirably be tailored to address particular difficulties posed by the heat sinks typically used in conjunction with GaN- and SiC-based MMICs. Specifically, the inventors discovered that various etchants can be added to the compositions to promote removal of a passivating metal oxide surface layer on the copper alloy heat sinks typically used with these types of MMICs, but without detrimentally impacting the metal nanoparticle consolidation process to form the thermal interface layer. At least partial removal of the passivating metal oxide surface layer can desirably increase the bonding strength between the MMIC and the surface of the heat sink. The metal nanoparticle compositions can also be tailored for use in conjunction with LEDs as well in order to realize similar advantages.

Further, the metal nanoparticle compositions can desirably be tailored to adjust the porosity of the thermal interface layer formed therefrom, which can help accommodate any remaining CTE mismatch within the device assemblies. Unlike voids, which undesirably result in a lack of a thermal interface material between a portion of the electronic component and the heat sink, porosity can be desirable, since a continuous thermal conduction pathway is still maintained. By maintaining porosity within the thermal interface layer, internal stress therein can be lessened, which might otherwise result in cracking and/or delamination. In various embodiments, the porosity of the thermal interface layer can range between about 1% to about 40%, as measured based upon the volume of internal free space remaining therein.

Finally, additional additives can desirably be introduced to the compositions to further increase their thermal conductivity values or other properties, again without compromising the metal nanoparticles' ability to form a thermal interface layer. Diamond particles represent an illustrative thermal conductivity enhancer with high thermal stability. Other additives that can be used to improve the thermal conductivity and/or tailor the CTE of the compositions include, for example, boron nitride, carbon nanotubes, chopped or milled carbon fibers, graphite powder, graphene, metals (e.g., W or Mo) and the like. Other suitable examples will be recognized by one having ordinary skill in the art.

As used herein, the term "metal nanoparticle" will refer to metal particles that are about 100 nm or less in size, without particular reference to the shape of the metal particles. As used herein, the term "bulk metal" will refer to metal particles that are larger than about 100 nm in size, particularly about 1 micron or larger in size, or to metal nanoparticles that have been at least partially fused together with one another to form a consolidated mass or layer.

Metal nanoparticles can exhibit a number of properties that differ significantly from those of the corresponding bulk metal. One property of metal nanoparticles that can be of particular importance is nanoparticle fusion or consolidation that occurs at the metal nanoparticles' fusion temperature. As used herein, the term "fusion temperature" will refer to the temperature at which a metal nanoparticle liquefies, thereby giving the appearance of melting. As used herein, the terms "fusion" or "consolidation" will refer to the coalescence or partial coalescence of metal nanoparticles with one another to form a larger mass, such as a layer defining a thermal interface. The terms "consolidate," "consolidation" and other variants thereof will be used interchangeably herein with the terms "fuse," "fusion" and other variants thereof. Upon decreasing in size, particularly below about 20 nm in equivalent spherical diameter, the temperature at which metal nanoparticles can be liquefied drops dramatically from that of the corresponding bulk metal. For example, copper nanoparticles having a size of about 20 nm or less can have fusion temperatures of about 220° C. or below, or about 200° C. or below, in comparison to bulk copper's melting point of 1083° C. After undergoing at least partial consolidation with one another to form a larger mass, the melting point increases, again approaching that of the corresponding bulk metal depending upon the degree of consolidation that has occurred. Accordingly, metal nanoparticles are particularly advantageous for forming a metallic thermal interface layer according to the embodiments of the present disclosure. Specifically, metal nanoparticle compositions provide for low temperature application of the metal nanoparticles prior to nanoparticle fusion, while supporting high operating temperatures following at least partial fusion of the metal nanoparticles. In addition, should rework be needed, such as to remove a failed electronic component, a bulk copper interface formed from metal nanoparticles can readily be disintegrated at low processing temperatures using bismuth metal, as described in commonly owned U.S. Pat. No. 8,167,189, which is incorporated herein by reference in its entirety.

As used herein, the terms "partially fused," "partial fusion," and other grammatical equivalents thereof will refer to the partial coalescence of metal nanoparticles with one another. Whereas totally fused, metal nanoparticles retain essentially none of the structural morphology of the original unfused metal nanoparticles (i.e., they resemble bulk metal), partially fused metal nanoparticles retain at least some of the structural morphology and properties of the original unfused metal nanoparticles. The properties of partially fused metal nanoparticles can be intermediate between those of the corresponding bulk metal and the original unfused metal nanoparticles.

A number of scalable processes for producing bulk quantities of metal nanoparticles in a targeted size range have been developed, several of which are further described hereinbelow. Such processes typically involve reducing a metal precursor in the presence of a surfactant, followed by isolation of the metal nanoparticles from the reaction mixture.

The synthesized metal nanoparticles can be formulated into various compositions that improve their dispensation properties and fusion to one another, as further discussed hereinbelow. Such compositions may be referred to herein as "nanoparticle paste compositions" or "nanoparticle paste formulations." As used herein, the terms "nanoparticle paste compositions" or "nanoparticle paste formulations" will refer to a dispensable viscous fluid containing metal nanoparticles within an organic matrix. Use of the term "paste" does not necessarily imply an adhesive function. The nanoparticle paste compositions can be desirably tailored to provide particular properties such as, for example, improved thermal conductivity values, a desired viscosity and application consistency, a decreased incidence of cracking and void formation during consolidation, matching the coefficients of thermal expansion of an electronic component and its heat sink, and the like.

In various embodiments, device assemblies containing metal nanoparticles are described herein. In some embodiments, device assemblies described herein contain a heat-generating electronic component in thermal communication with a metallic heat sink via a metallic thermal interface layer.

The metallic thermal interface layer is disposed between the heat-generating electronic component and the metallic heat sink. The metallic thermal interface layer is formed from a composition containing a plurality of metal nanoparticles that are at least partially fused together with one another. Illustrative electronic components can include, for example, MMICs and LEDs.

Figure 5A:
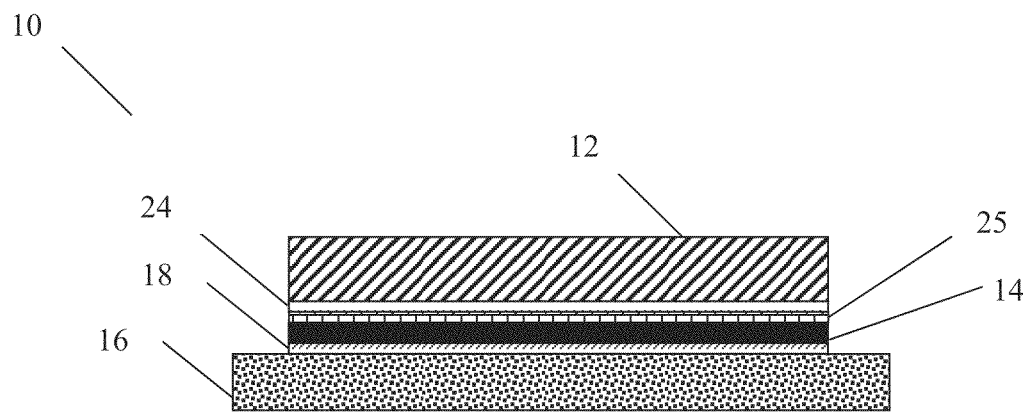
FIGS. 5A and 5B show schematics of an illustrative device assembly according to the embodiments of the present disclosure, prior to and after at least partial fusion of the metal nanoparticles therein.
Figure 5B:
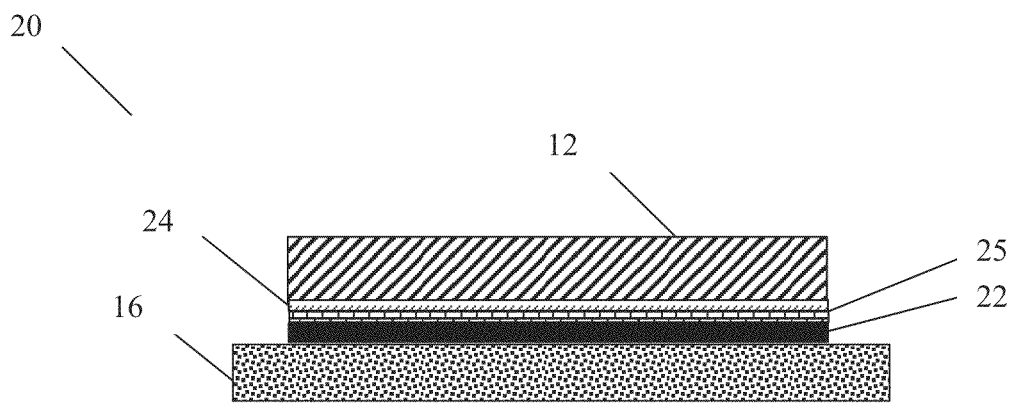

FIGS. 5A and 5B show schematics of an illustrative device assembly according to the embodiments of the present disclosures prior to and after at least partial fusion of the metal nanoparticles therein. As depicted in FIG. 5A, unfinished device assembly 10 includes metallic heat sink 16, upon which is deposited heat-generating electronic component 12. In some embodiments, heat-generating electronic component 12 can operate in the microwave frequency range, such as a monolithic microwave integrated circuit, as discussed further herein. Disposed between metallic heat sink 16 and heat-generating electronic component 12 is metal nanoparticle composition 14, which contains copper nanoparticles in some embodiments. It is to be recognized that other heat-generating electronic components 12 may be joined to a heat sink 16 in a similar manner in order to promote heat dissipation therefrom. Other illustrative electronic components 12 can include, for example, power amplifiers, frequency modulators, analog to digital converters (A/D converters), application-specific integrated circuits (ASICs), mixers, field programmable gate arrays (FPGAs), receivers, transmitters, tuners, microwave power modules (MPMs), integrated power conditioners (IPC), power supplies, power converters, LEDs, laser diodes and X-ray anodes.

As discussed herein, high-power LEDs can be bonded to a heat sink using copper nanoparticles in a similar manner to those described for MMICs. Any of the processing techniques discussed herein can be used to join an LED to a heat sink through appropriate modifications that will be evident to one having ordinary skill in the art and the benefit of the present disclosure.

In some embodiments, the heat-generating electronic component can be a monolithic microwave integrated circuit, particularly a monolithic microwave integrated circuit having a substrate formed from GaN or SiC. Copper alloy heat sinks, such as WCu or MoCu heat sinks, can be particularly desirable for use in conjunction with such heat-generating electronic components, as discussed further herein. Aluminum heat sinks, including those having a copper alloy coating, can be used similarly in the embodiments described herein.

In some embodiments, metallic heat sink 16 can be formed from metals or metal alloys such as, for example, Al, Sn, SnAgCu, W, WCu, Mo, MoCu and the like. Copper alloy-coated aluminum heat sinks can also be used. In some embodiments, graphite, copper-carbon nanotube composites, copper-carbon fiber composites, copper-aluminum alloys, or metal-diamond composites can be as the heat sink. In various embodiments, these and other metallic heat sinks can include passivating metal oxide surface layer 18 that is formed through surface oxidation of the metal. As discussed further below, metal nanoparticle composition 14 can contain an additive that at least partially etches passivating metal oxide surface layer 18 to result in establishment of a direct thermal contact between metallic heat sink 16 and at least a portion of metallic thermal interface layer 22 in finished device assembly 20, as depleted in FIG. 5B.

Referring still to FIGS. 5A and 5B, there can be additional layers coated on the underside of heat-generating electronic component 12. In order to increase the efficacy of bonding thereto. These layers do not significantly impact the efficacy of heat transfer from heat-generating electronic component 12. In some embodiments, adhesion, layer 24, such as a Ti or Cr layer, is deposited directly on the underside of heat-generating electronic component 12 through a suitable thin-layer deposition technique. Suitable thin-layer deposition techniques include, for example, sputtering, atomic layer deposition, chemical vapor deposition and the like. Thereafter, metal bonding layer 25 is deposited on adhesion layer 24. In some embodiments, metal bonding layer 25 can be formed from copper. Other suitable metal bonding layers can include silver, gold, nickel, platinum and palladium. That, is, in some embodiments, a substrate surface of the electronic component adjacent to the metallic thermal interface layer can be coated with a metal selected from the group consisting of copper, silver, gold, nickel, platinum, palladium, or any combination thereof. Thicknesses of metal bonding layer 25 can range between about 10 nm to about 5 microns, such as between about 10 nm and 100 nm, or between about 100 nm and about 1 micron, or between about 1 micron and about 5 microns. Unlike passivating metal oxide surface layer 18, adhesion layer 24 and metal bonding layer 25 are not removed in the course of forming finished device assembly 20 upon at least partially fusing the metal nanoparticles together with one another, as depicted in FIG. 5B.

In some embodiments, the heat-generating electronic component can operate in the microwave frequency range (i.e., 300 MHz to 300 GHz). As discussed above, some embodiments of the device assemblies of the present disclosure can include a monolithic microwave integrated circuit that is in thermal communication with a heat sink via a metallic thermal interface layer formed from metal nanoparticles that are at least partially fused together with one another. The function of the MMIC or the device assembly formed therefrom is not considered to be particularly limited. Illustrative functions of the MMIC can include, but are not limited to, microwave mixing, power amplification, low-noise amplification, high-frequency switching, frequency modulation, reception, transmission, power conditioning and any combination thereof. In various embodiments, the device assemblies containing MMICs can be used in a variety of RF applications including communications and radar systems. Suitable configurations and functions for MMICs will be familiar to one having ordinary skill in the art and thus will not be further described in detail herein, except as specified below.

In some embodiments, the MMICs of the device assemblies described herein can include a substrate formed from GaN or SiC. That is, the circuitry of the MMIC can be manufactured on or within the substrate, and the underside of the substrate can be contacted with the metallic thermal interface layer in the device assembly. As discussed above, MMICs containing one or both of these materials can be particularly thermally resistant, thereby providing impetus for developing thermal interface materials that are capable of supporting their higher operating temperatures, such as through the embodiments of the present disclosure. Alternative MMIC substrates can be formed from substances such as, for example, GaAs, InP, Si, SiGe, GaN, AlGaN on SiC, and GaN on SiC.

In various embodiments, the metallic thermal interface layer formed from metal nanoparticles according to the disclosure herein can have a thermal conductivity value of up to about 200 W/m·K or up to about 600 W/m·K. In more particular embodiments, the metallic thermal interface layer can have a thermal conductivity value ranging between about 100 W/m·K and about 600 W/m·K, or between about 100 W/m·K and about 200 W/m·K, or between about 200 W/m·K and about 300 W/m·K, or between about 300 W/m·K and about 400 W/m·K, or between about 400 W/m·K and about 500 W/m·K, or between about 500 W/m·K and about 600 W/m·K.

The metallic thermal interface layer disposed between the electronic component and the heat sink can desirably be made very thin in order to support a high rate of heat transfer therebetween. In some embodiments, the thickness of the metallic thermal interface layer can be less than about 100 microns, particularly between about 1 micron and about 100 microns. In more specific embodiments, the thickness of the metallic thermal interface layer can range between about 2 microns and about 50 microns, or between about 3 microns and about 20 microns, or between about 4 microns and about 15 microns, or between about 5 microns and about 10 microns, or between about 2 microns and about 5 microns.

In some embodiments, the metallic thermal interface layer can be porous. In some embodiments, the porosity of the metallic thermal interface layer can range between about 1% and about 40%, more particularly between about 5% and about 40%. In more specific embodiments, the porosity of the metallic thermal interface layer can range between about 1% and about 5%, or between about 5% and about 10%, or between about 10% and about 20%, or between about 20% and about 30%, or between about 30% and about 40%, or between about 10% and about 25%, or between about 25% and about 40%.

In some embodiments, the device assemblies described herein can include a metallic heat sink formed from a copper alloy, including copper alloys coated upon an aluminum substrate. As discussed above, copper alloys can be particularly desirable for matching the coefficient of thermal expansion of MMICs formed on a GaN or SiC substrate. Particularly suitable copper alloys for use in conjunction with such MMICs can include WCu alloys and MoCu alloys. For example, an illustrative MoCu alloy suitable for use in conjunction with GaN-based MMICs can include about 85% Mo and about 15% Cu. Variation of the two components in proportion to each other is also possible. Similarly, illustrative WCu alloys suitable for use in conjunction with GaN-based MMICs can include about 50-90% W and about 10-50% Cu. Copper nanoparticles can be particularly suitable for use in conjunction with such copper alloy heat sinks in order to form a thermal interface layer thereon. Copper nanoparticles containing various conductive additives (e.g., diamond, boron nitride, carbon nanotubes, graphene, carbon fibers, and like materials discussed herein) can be similarly advantageous in this regard.

In some embodiments, the metallic heat sink can include a passivating metal oxide surface layer thereon. Metal heat sinks formed from a copper alloy, particularly those described above, can be particularly susceptible to formation of a metal oxide surface layer due to their reaction with atmospheric oxygen. As discussed above, the passivating metal oxide surface layer can be problematic if not removed prior to forming a thermal interface layer on the metallic heat sink.

Although a passivating metal oxide surface layer can be removed (e.g., through acid etching) from a metallic heat sink before deposition of a metal nanoparticle composition thereon, it can be very difficult to avoid re-forming the metal oxide layer prior to completing the fabrication of a device assembly. For example, vacuum or inert atmosphere working conditions can sometimes be necessary to protect a metallic heat sink that has had its passivating metal oxide surface layer removed, which can significantly increase the time and expense needed to complete the fabrication of a device assembly of the present disclosure.

It can often be more desirable to conduct In situ removal of a passivating metal oxide surface layer when fabricating the device assemblies of the present disclosure. That is, the passivating metal oxide surface layer is desirably removed with the other components already situated in place. Specifically, in some embodiments, the composition from which the metallic thermal interface layer is formed can also contain an etchant capable of etching or at least partially removing a metal oxide from the metallic heat sink. Such etching can occur in conjunction with at least partially fusing the metal nanoparticles of the composition together with one another.

In some embodiments, suitable etchants can include various acids and acid-generating compounds. Although one has some levity in choosing a suitable acid or acid-generating compound, the strength and concentration of the acid should be sufficiently low to not substantially react with or oxidize the metal nanoparticles or the metallic thermal interface layer formed therefrom. In more specific embodiments, the etchant can include a carboxylic acid or an anhydride thereof. One of ordinary skill in the art will recognize the utility of anhydrides in this regard, since they can be decomposed chemically to the corresponding free acid under mild, controlled conditions, thereby keeping the concentration of the free acid at a desirably low level. Carboxylic esters can be used in a similar vein as an acid-generating compound.

Even when generating an etchant from an acid-generating compound, not all carboxylic acids are necessarily suitable for practicing the embodiments described herein. For example, some carboxylic acids can be too acidic to be present in conjunction with metal nanoparticles or a metallic thermal interface layer formed therefrom, even when produced in situ from an acid-generating compound. Carboxylic acid etchants are most desirably in a liquid state when etching the passivating metal oxide surface layer of the heat sink, such that they can percolate through the metal nanoparticle matrix and more effectively contact the surface layer. However, carboxylic acid etchants or precursors thereof are desirably not incorporated in the metal nanoparticle composition in a liquid state, since they can prematurely react with the surface layer or the metal nanoparticles when liquefied. Most desirably, the carboxylic acid or precursor thereof is incorporated in the metal nanoparticle composition as a solid, and a liquid state free acid is then formed upon heating, ideally below the fusion temperature of the metal nanoparticles. For example, when utilizing copper nanoparticles in the embodiments described herein, the carboxylic acid can have a melting point below about 200° C. in order to be below the fusion, temperature of the copper nanoparticles, which can be in the 200-220° C. range depending on their size. By forming a liquefied carboxylic acid etchant below the fusion temperature of the metal nanoparticles, the passivating metal oxide surface layer can be effectively removed before the metal nanoparticles liquefy, directly contact the metallic heat sink, and subsequently re-solidify to form a metallic thermal interface layer in which the metal nanoparticles are at least partially fused together with one another. Given the knowledge of one having ordinary skill in the art and having the benefit of this disclosure, one having ordinary skill in the art will be able to choose a suitable carboxylic acid or precursor thereof for practicing the embodiments of the present disclosure.

In still more specific embodiments, a particularly suitable etchant for practicing the disclosure herein can be abietic acid or an anhydride thereof. The structure of abietic acid and its anhydride are shown in Formulas 1 and 2, respectively.

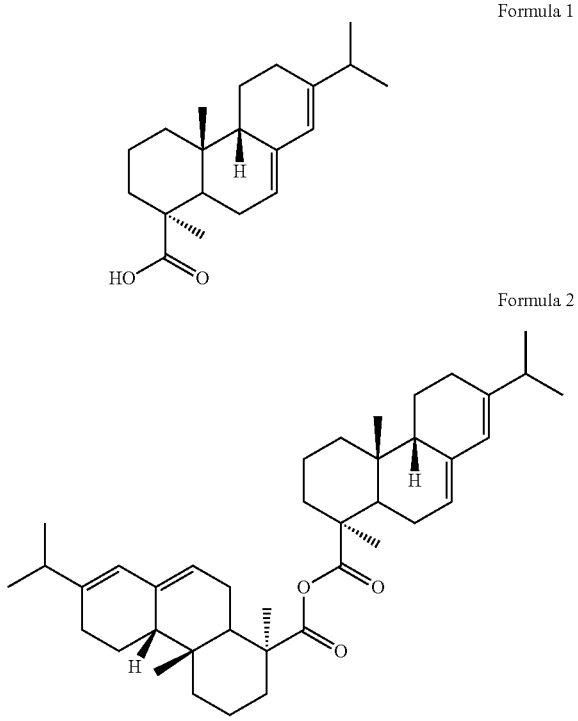

Formula 1

Formula 2

Abietic acid and other like rosin acids are tacky solids that melt well below the fusion temperature of copper nanoparticles (melting point of abietic acid=140° C.), which collectively make them suitable for incorporation in the nanoparticle compositions described herein. Abietic acid and other like rosin acids are also commonly used in forming electronic devices as part of a soldering flux, which makes them compatible with existing manufacturing techniques. Mixtures of abietic acid with more reactive acids or acid precursors can also be used in conjunction with the embodiments described herein.

In general the structure of the acid or acid precursor is balanced between reactivity and volatility. Shorter chain carboxylic acid and acid precursors are generally too reactive, whereas longer chain acids and acid precursor can lack sufficient reactivity and especially volatility needed for removal from the thermal interface. Acid remaining in the thermal interface can result in decreased thermal communication and produce long-term corrosion Issues. Other than abietic acid and like compounds, particularly suitable acids or acid precursors can, in some embodiments, contain between about 14 and about 18 carbon atoms, which can be branched, straight chained, ringed, saturated, unsaturated, or any combination thereof. Preferably melting points for the acids can range between about 40° C. and about 175° C. For example, satiable acids may include salicylic acid derivatives or anhydrides thereof that contain alkyl or acyl groups. In various embodiments, the acid can be present at a concentration ranging between about 0.1 % to 3.5% of the composition by weight.

In some embodiments, heating of the acid or the acid-generating compound to remove the passivating metal oxide surface layer can take place in the presence of a water source. In many cases, the water source is atmospheric moisture, which can promote the breakdown of an acid precursor into the free acid. In some or other embodiments, a hydrated material (e.g., an inorganic or organic hydrated material containing at least one water of hydration) that releases its water of hydration at a temperature below the decomposition temperature of the acid-generating compound can be used to promote formation of an acid during heating. In situ generation of water from a hydrated material can be desirable to slow down the reaction process and extend the pot life of the compositions. Moreover, a hydrated material can prevent premature reaction with the water in producing an acid or an acid-generating compound.

Instead of or in addition to the etchant, the nanoparticle compositions can also further include an additive that increases the thermal conductivity of the metallic thermal interface layer in the device assembly. In some embodiments, the additive can be a plurality of diamond particles, including both nanodiamond and micron-sized diamond particles. Diamond particles can also advantageously adjust the coefficient of thermal expansion of the metallic thermal interface layer, since it demonstrates minimal thermal expansion in comparison to the bulk metal formed from the metal nanoparticles. Hence, the more diamond particles that are present in the composition, the lower the coefficient of thermal expansion effectively becomes. Other suitable thermal conductivity-enhancing additives that can be present instead of or in addition to diamond particles include, for example, bulk metal particles, graphite particles, graphene particles (both single and few-layer graphene), carbon black particles, amorphous carbon particles, chopped or milled carbon fibers, boron nitride particles, silicon carbide particles, the like and any combination thereof.

When present, an amount of the one or more additives in the compositions can range from above zero to about 50% by weight of the composition. In more specific embodiments, the one or more additives can be present in a range from about 0.1% to about 40% by weight of the composition, or from about 1% to about 25% by weight of the composition, or from about 5% to about 20% by weight of the composition, or about 10% to about 35% by weight of the composition.

In more specific embodiments, the metal nanoparticles are copper nanoparticles. Copper nanoparticles are considered advantageous in the context of the present embodiments for the reasons mentioned above. It should be recognized, however, that other types of metal nanoparticles can replace copper at the discretion of one having ordinary skill in the art. Other suitable metal nanoparticles that can be present in the compositions and used in conjunction with forming a thermal interface layer, either individually or in combination with copper nanoparticles include, but are not limited to, nickel nanoparticles, aluminum nanoparticles, tin nanoparticles, silver nanoparticles, palladium nanoparticles, iron nanoparticles, cobalt nanoparticles, titanium nanoparticles, zirconium nanoparticles, hafnium nanoparticles, tantalum nanoparticles, gold nanoparticles, the like and any combination thereof. Any of these metals can also be used to form a shell upon copper nanoparticles in various configurations of the present disclosure.

Figure 6:
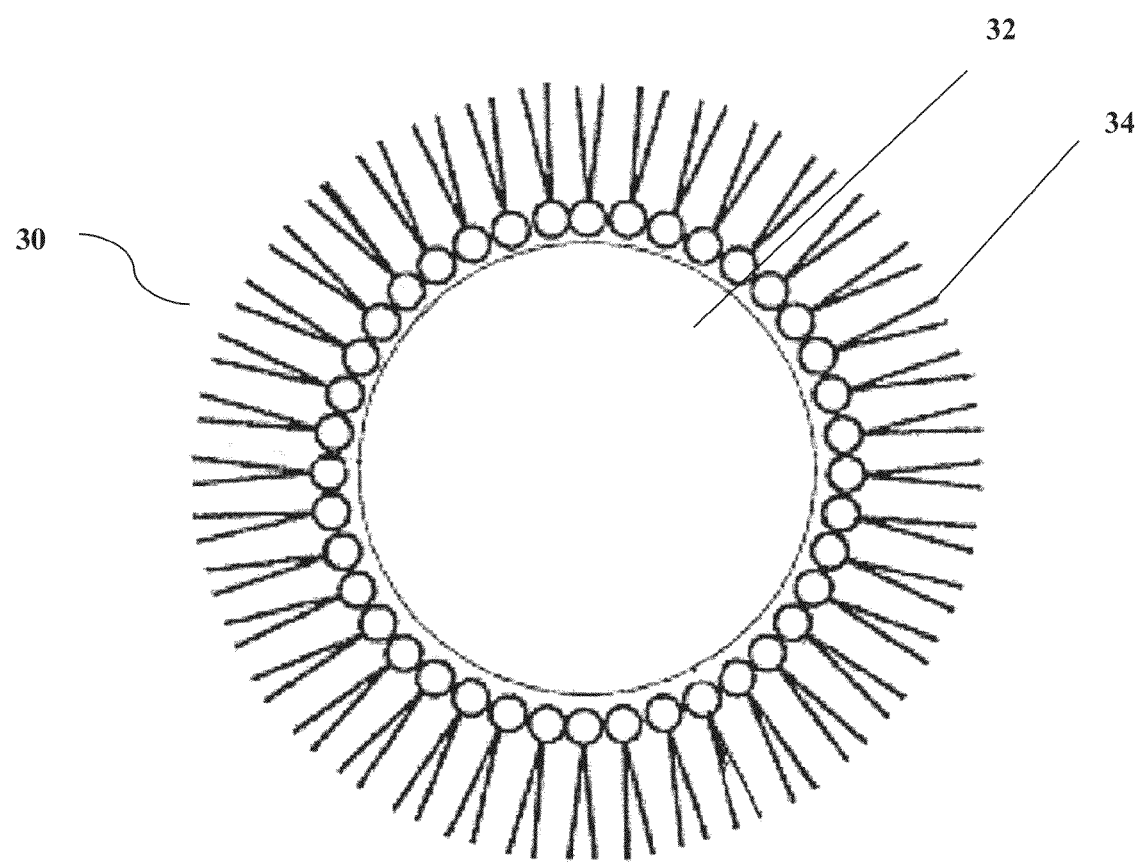
FIG. 6 shows the presumed structure of an illustrative metal nanoparticle having a surfactant coating thereon.

Particularly facile metal nanoparticle fabrication techniques are described in commonly owned U.S. Pat. Nos. 7,736,414, 8,105,414, 8,192,866, and 8,486,305; and commonly owned United States Patent Application Publications 2011/0215279, 2012/0114521, and 2013/0209692, each of which is incorporated herein by reference in its entirety. As described therein, metal nanoparticles can be fabricated, in a narrow size range by reduction of a metal salt in a solvent in the presence of a suitable surfactant system. Further description of suitable surfactant systems follows below. In the presence of a suitable surfactant system, metal nanoparticles having a size range between about 1 nm and about 50 nm and including a surfactant coating thereon can be produced. In more particular embodiments, metal nanoparticles having a surfactant coating and a size range between about 1 nm and about 20 nm, or between about 1 nm and about 10 nm, or between about 1 nm and about 7 nm, or between about 1 nm and about 5 nm can be produced. Without being bound by any theory or mechanism, FIG. 6 shows the presumed structure of an illustrative metal nanoparticle having a surfactant coating thereon. As shown in FIG. 6, metal, nanoparticle 30 includes metal sphere 32 and surfactant coating 34 disposed thereon. Remaining unbound by any theory or mechanism, it is believed that the surfactant system can mediate the nucleation and growth of the metal nanoparticles, limit surface oxidation of the metal nanoparticles, and/or inhibit metal nanoparticles from extensively aggregating with one another prior to nanoparticle fusion.

Suitable organic solvents for solubilizing metal salts and forming metal nanoparticles can include aprotic solvents such as, for example, formamide, N,N-dimethylformamide, dimethyl sulfoxide, dimethylpropylene urea, hexamethylphosphoramide, tetrahydrofuran, glyme, diglyme, triglyme, tetraglyme and the like. Reducing agents suitable for reducing metal salts and promoting the formation of metal nanoparticles can include, for example, an alkali metal in the presence of a suitable catalyst (e.g., lithium naphthalide, sodium naphthalide, or potassium naphthalide) or borohydride reducing agents (e.g., sodium borohydride, lithium borohydride, potassium borohydride, or a tetraalkylammonium borohydride).

In various embodiments, the surfactant system used to prepare the metal nanoparticles can include one or more surfactants. The differing properties of various surfactants can be used to tailor the properties of the metal nanoparticles, such as their size. Factors that can be taken into account when selecting a surfactant or combination of surfactants for use in synthesizing metal nanoparticles can include, for example, ease of surfactant dissipation from the metal nanoparticles during nanoparticle fusion, nucleation, and growth rates of the metal nanoparticles, affinity of the surfactants with the chosen metal, and the like.

In some embodiments, an amine surfactant or combination of amine surfactants, particularly aliphatic amines, can be used during the synthesis of metal nanoparticles. In some embodiments, two amine surfactants can be used in combination with one another. In other embodiments, three amine surfactants can be used in combination with one another. In more specific embodiments, a primary amine, a secondary amine, and a diamine chelating agent can be used in combination with one another. In still more specific embodiments, the three amine surfactants can include a long chain primary amine, a secondary amine, and a diamine having at least one tertiary alkyl group nitrogen substituent. Further disclosure regarding suitable amine surfactants follows hereinafter.

In some embodiments, the surfactant system can include a primary alkylamine. In some embodiments, the primary alkylamine can be a $C_2$-$C_{18}$ alkylamine. In some embodiments, the primary alkylamine can be a $C_7$-$C_{10}$ alkylamine. In other embodiments, a $C_5$-$C_6$ primary alkylamine can also be used. Without being bound by any theory or mechanism, the exact size of the primary alkylamine can be balanced between being long enough to provide an effective inverse micelle structure versus having ready volatility and/or ease of handling. For example, primary alkylamines with more than 18 carbons can also be suitable for use in the present embodiments, but they can be more difficult to handle because of their waxy character. $C_7$-$C_{10}$ primary alkylamines, in particular, can represent a good balance of desired properties for ease of use.

In some embodiments, the $C_2$-$C_{18}$ primary alkylamine can be n-heptylamine, n-octylamine, n-nonylamine, or n-decylamine, for example. While these are all straight chain, primary alkylamines, branched chain primary alkylamines can also be used in other embodiments. For example, branched chain primary alkylamines such as, for example, 7-methyloctylamine, 2-methyloctylamine, or 7-methylnonylamine can be used in some embodiments. In some embodiments, such branched chain primary alkylamines can be sterically hindered where they are attached to the amine nitrogen atom. Non-limiting examples of such sterically hindered primary alkylamines can include, for example, t-octylamine, 2-methylpentan-2-amine, 2-methylhexan-2-amine, 2-methylheptan-2-amine, 3-ethyloctan-3-amine, 3-ethylheptan-3-amine, 3-ethylhexan-3-amine, and the like. Additional branching can also be present. Without being bound by any theory or mechanism, it is believed that primary alkylamines can serve as ligands in the metal coordination sphere but can be readily dissociable during metal nanoparticle fusion.

In some embodiments, the surfactant system can include a secondary amine, Secondary amines suitable for forming metal nanoparticles can include normal branched, or cyclic $C_4$-$C_{12}$ alkyl groups bound to the amine nitrogen atom. In some embodiments, the branching can occur on a carbon atom bound to the amine nitrogen atom, thereby producing significant steric encumbrance at the nitrogen atom. Suitable secondary amines can include, without limitation, dihexylamine, diisobutylamine, di-t-butylamine, dineopentylamine, di-t-pentylamine, dicyclopentylamine, dicyclohexylamine, and the like. Secondary amines outside the $C_4$-$C_{12}$ range can also be used, but such secondary amines can have undesirable physical properties such as low boiling points or waxy consistencies that can complicate their handling.

In some embodiments, the surfactant system can include a chelating agent, particularly a diamine chelating agent. In some embodiments, one or both of the nitrogen atoms of the diamine chelating agent can be substituted with one or two alkyl groups. When two alkyl groups are present on the same nitrogen atom, they can be the same or different. Further, when both nitrogen atoms are substituted, the same or different alkyl groups can be present. In some embodiments, the alkyl groups can be $C_1$-$C_6$ alkyl groups. In other embodiments, the alkyl groups can be $C_1$-$C_4$ alkyl groups or $C_3$-$C_6$ alkyl groups. In some embodiments, $C_3$ or higher alkyl groups can be straight or have branched chains. In some embodiments, $C_3$ or higher alkyl groups can be cyclic. Without being bound by theory or mechanism, it is believed that diamine chelating agents can facilitate metal nanoparticle formation by promoting nanoparticle nucleation.

In some embodiments, suitable diamine chelating agents can include N,N'-dialkylethylenediamines, particularly $C_1$-$C_4$ N,N'-dialkylethylenediamines. The corresponding methylenediamine, propylenediamine, butylenediamine, pentylenediamine or hexylenediamine derivatives can also be used. The alkyl groups can be the same or different. $C_1$-$C_4$ alkyl groups that can be present include, for example, methyl, ethyl, propyl, and butyl groups, or branched alkyl groups such as isopropyl, isobutyl, s-butyl, and t-butyl groups. Illustrative N,N'-dialkylethylenediamines that can be suitable for use in forming metal nanoparticles include, for example, N,N'-di-t-butylethylenediamine, N,N'-diisopropylethylenediamine, and the like.

In some embodiments, suitable diamine chelating agents can include N,N,N',N'-tetraalkylethylenediamines, particularly $C_1$-$C_4$ N,N,N',N'-tetraalkylethylenediamines. The corresponding methylenediamine, propylenediamine, butylenediamine, pentylenediamine or hexylenediamine derivatives can also be used. The alkyl groups can again be the same or different and include those mentioned above. Illustrative N,N,N',N'-tetraalkylethylenediamines that can be suitable for use in forming metal nanoparticles include, for example, N,N,N',N'-tetramethylethylenediamine, N,N,N',N'-tetraethylethylenediamine, and the like.

Surfactants other than aliphatic amines can also be present in the surfactant system. In this regard, suitable surfactants can include, for example, pyridines, aromatic amines, phosphates, thiols, or any combination thereof. These surfactants can be used in combination with an aliphatic amine, including those described above, or they can be used in a surfactant system in which an aliphatic amine is not present. Further disclosure regarding suitable pyridines, aromatic amines, phosphines, and thiols follows below.

Suitable aromatic amines can have a formula of $ArNR^1R^2$ where Ar is a substituted or unsubstituted aryl group and $R^1$ and $R^2$ are the same or different. $R^1$ and $R^2$ can be independently selected from H or an alkyl or aryl group containing from 1 to about 16 carbon atoms. Illustrative aromatic amines that can be suitable for use in forming metal nanoparticles include, for example, aniline, toluidine, anisidine, N,N-dimethylaniline, N,N-diethylaniline, and the like. Other aromatic amines that can be used in conjunction with forming metal nanoparticles can be envisioned by one having ordinary skill in the art.

Suitable pyridines can include both pyridine and its derivatives. Illustrative pyridines that can be suitable for use in forming metal nanoparticles include, for example, pyridine, 2-methylpyridine, 2,6-dimethylpyridine, collidine, pyridazine, and the like. Chelating pyridines such as bipyridyl chelating agents may also be used. Other pyridines that can be used in conjunction with forming metal nanoparticles can be envisioned by one having ordinary skill in the art.

Suitable phosphines can have a formula of $PR_3$, where R is an alkyl or aryl group containing from 1 to abbot 16 carbon atoms. The alkyl or aryl groups attached to the phosphorus center can be the same or different. Illustrative phosphines that can be used in forming metal nanoparticles include, for example, trimethylphosphine, triethylphosphine, tributylphophine, tri-t-butylphosphine, trioctylphosphine, triphenylphosphine, and the like. Phosphine oxides can also be used in a like manner. In some embodiments, surfactants that contain two or more phosphine groups configured for forming a chelate ring can also be used. Illustrative chelating phosphines can include 1,2-bisphosphines, 1,3-bisphosphines, and bis-phosphines such as BINAP, for example. Other phosphines that can be used in conjunction with forming metal nanoparticles can be envisioned by one having ordinary skill in the art Suitable thiols can have a formula of RSH, where R is an alkyl or aryl group having from about 4 to about 16 carbon atoms. Illustrative thiols that can be used for forming metal nanoparticles include, for example, butanethiol, 2-methyl-2-propanethiol, hexanethiol, octanethiol benzenethiol, and the like. In some embodiments, surfactants that contain two or more thiol groups configured for forming a chelate ring can also be used. Illustrative chelating thiols can include, for example, 1,2-dithiols (e.g., 1,2-ethanethiol) and 1,3-dithiols (e.g., 1,3-propanethiol). Other thiols that can be used in conjunction with forming metal nanoparticles can be envisioned by one having ordinary skill in the art.

Decreased cracking and void formation during metal nanoparticle consolidation can also be promoted by judicious choice of the solvent(s) forming the organic matrix of the nanoparticle compositions used in various embodiments of the present disclosure. In this regard, a tailored combination of organic solvents can promote consolidation of the metal nanoparticles with a decreased incidence of cracking and void formation. More particularly, an organic matrix containing one or more hydrocarbons, one or more alcohols, one or more amines, and one or more organic acids can be especially effective for this purpose. Without being bound by any theory or mechanism, it is believed that this combination of organic solvents can facilitate the removal and sequestration of surfactant molecules surrounding the metal nanoparticles, such that the metal nanoparticles can more easily fuse together with one another. More particularly, it is believed that hydrocarbon and alcohol solvents can passively solubilize surfactant molecules released from the metal nanoparticles by Brownian motion and reduce their ability to become reattached thereto. In concert with the passive solubilization of surfactant molecules, amine and organic acid solvents can actively sequester the surfactant molecules through a chemical interaction such that they are no longer available for recombination with the metal nanoparticles.

Further tailoring of the solvent composition can be performed to reduce the suddenness of volume contraction that takes place during surfactant removal and metal nanoparticle consolidation. Specifically, more than one member of each class of organic solvent (i.e., hydrocarbons, alcohols, amines, and organic acids), can be present in the organic matrix, where the members of each class have boiling points that are separated from one another by a set degree. For example, in some embodiments, the various members of each class can have boiling points that are separated from one another by about 20° C. to about 50° C. By using such a solvent mixture, sudden volume changes due to rapid loss of solvent can be minimized during metal nanoparticle consolidation, since the various components of the solvent mixture can be removed gradually over a broad range of boiling points (e.g., about 50° C. to about 200° C.).

In addition to tailoring the nanoparticle compositions, the heating profile used to promote thermal consolidation of the metal nanoparticles can also influence the degree of cracking and void formation. In general, slow heating of the nanoparticle compositions up to the fusion temperature of the metal nanoparticles can desirably reduce the degree of cracking and void formation. Further, holding the temperature at one or more temperature plateaus below the fusion temperature can also desirably reduce the incidence of cracking and void formation by slowly removing the most volatile components of the compositions before the occurrence of metal nanoparticle fusion. Again without being bound by any theory or mechanism, it is believed that slow heating and/or thermal plateaus can desirably decrease the volume contraction that occurs during surfactant and solvent removal, thereby decreasing the incidence of cracking and void formation during metal nanoparticle consolidation.

In some embodiments, the nanoparticle compositions can be formulated to have a desired viscosity in order to promote their dispensation and application to a heat source or a heat sink. Given the benefit of this disclosure, one of ordinary skill in the art will be able to prepare a nanoparticle composition having a desired viscosity that maintains the other features described herein. In various embodiments, the nanoparticle compositions can have a viscosity ranging between about 1000 cP and about 250,000 cP, or between about 5,000 cP and about 200,000 cP, or between about 25,000 cP and about 250,000 cP, or between about 50,000 cP and about 250,000 cP, or between about 100,000 cP and about 250,000 cP, or between about 150,000 cP and about 250,000 cP, or between about 100,000 cP and about 200,000 cP, or between about 100,000 cP and about 200,000 cP, or between about 100,000 cP and about 150,000 cP, or between about 150,000 cP and about 200,000 cP. The viscosity of the nanoparticle compositions can be modulated by numerous factors including, for example, choice of the various organic solvents in the organic matrix, the quantity of metal nanoparticles and other solids in the organic matrix, the size of the metal nanoparticles and the overall particle size within the compositions, and the addition of various thickening and rheology control agents to the compositions.

In some embodiments, the nanoparticle compositions can have a maximum particle size of about 75 microns or less. In other embodiments, the nanoparticle compositions can have a maximum particle size of about 50 microns or less, or about 40 microns or less, or about 30 microns or less, or about 20 microns or less, or about 10 microns or less. The maximum particle size can include agglomerates of metal nanoparticles with themselves and with other components of the nanoparticle compositions (e.g., thermal conductivity enhancers or micron-scale metal particles).

In various embodiments, at least a portion of the metal nanoparticles present in the nanoparticle compositions can be about 20 nm or less in size. As discussed above, metal nanoparticles in this size range have fusion temperatures that are significantly lower than those of the corresponding bulk metal and readily undergo consolidation with one another as a result. In some embodiments, copper nanoparticles that are about 20 nm or less in size can have a fusion temperature of about 220° C. or below (e.g., a fusion temperature in the range of about 150° C. to about 220° C.) or about 200° C. or below, which can provide advantages that are noted above. In some embodiments, at least a portion of the metal nanoparticles can be about 10 nm or less in size, or about 5 nm of less in size. In some embodiments, at least a portion of the metal nanoparticles can range between about 1 nm in size to about 20 nm in size, or between about 1 nm in size and about 10 nm in size, or between, about 1 nm in size to about 5 nm in size, or between about 3 nm in size to about 7 nm in size, or between about 5 nm in size to about 20 nm in size. In some embodiments, substantially all of the metal nanoparticles can reside within these size ranges. In some embodiments, larger metal nanoparticles can be combined in the compositions with metal nanoparticles that are about 20 nm in size or less. For example, in some embodiments, metal nanoparticles ranging from about 1 nm to about 10 nm in size can be combined with metal nanoparticles that range from about 25 nm to about 50 nm in size, or with metal nanoparticles that range from about 25 nm to about 100 nm in size. As further discussed below, micron-scale metal particles or nanoscale particles can also be included in the nanoparticle compositions in some embodiments. Although larger metal nanoparticles and micron-scale metal particles may not be liquefiable at low temperatures, they can still become consolidated upon contacting liquefied metal nanoparticles at or above their fusion temperature, as generally discussed above.

In some embodiments, the organic matrix can contain one or more organic solvents. In some embodiments, at least some of the one or more organic solvents can have a boiling point of about 100° C. or greater. In some embodiments, at least some of the one or more organic solvents can have a boiling point of about 200° C. or greater. In some embodiments, the one or more organic solvents can have boiling points ranging between about 50° C. and about 200° C., else of high boiling organic solvents can desirably increase the pot life of the nanoparticle compositions and limit the rapid loss of solvent, which can lead to cracking and void formation during nanoparticle consolidation. In some embodiments, at least some of the organic solvents can have a boiling point that is higher than those of the surfactants associated with the metal nanoparticles. Accordingly, surfactant can be removed from the metal nanoparticles by evaporation before removal of the organic solvent(s) takes place.

In some embodiments, the organic matrix can contain one or more alcohols. In various embodiments, the alcohols can include monohydric alcohols, diols, triols, glycol ethers (e.g., diethylene glycol and triethylene glycol), alkanolamines (e.g., ethanolamine, triethanolamine, and the like), or any combination thereof. In some embodiments, one or more hydrocarbons can be present in combination with one or more alcohols. As discussed above, it is believed that alcohol and hydrocarbon solvents can passively promote the solubilization of surfactants as they are removed from the metal nanoparticles by Brownian motion and limit their re-association with the metal nanoparticles. Moreover, hydrocarbon and alcohol solvents only weakly coordinate with metal nanoparticles, so they do not simply replace the displaced surfactants in the nanoparticle coordination sphere. Illustrative but non-limiting examples of alcohol and hydrocarbon solvents that can be present in the nanoparticle compositions include, for example, light aromatic petroleum distillate (CAS 64742-95-6), hydrotreated light petroleum distillates (CAS 64742-47-8), tripropyleneglycol methyl ether, ligroin (CAS 68551-17-7, a mixture of $C_{10}$-$C_{13}$ alkanes), diisopropyleneglycol monomethyl ether, diethyleneglycol diethyl ether, 2-propanol, 2-butanol, t-butanol, 1-hexanol, 2-(2-butoxyethoxy) ethanol, and terpineol. In some embodiments, polyketone solvents can be used in a like manner.

In some embodiments, the organic matrix can contain one or more amines and one or more organic acids. In some embodiments, the one or more amines and one or more organic acids can be present in an organic matrix that also includes one or more hydrocarbons and one or more alcohols. As discussed above, it is believed that amines and organic acids can actively sequester surfactants that have been passively solubilized by hydrocarbon and alcohol solvents, thereby making the surfactants are unavailable for re-association with the metal nanoparticles. Thus, an organic solvent that contains a combination of one or more hydrocarbons, one or more alcohols, one or more amines, and one or more organic acids can provide synergistic benefits for promoting the consolidation of metal nanoparticles. Illustrative but non-limiting examples of amine solvents that can be present in the nanoparticle paste formulations include, for example, tallowamine (CAS 61790-33-8), alkyl ($C_8$-$C_{18}$) unsaturated amines (CAS 68037-94-5), di(hydrogenated tallow)amine (CAS 61789-79-5), dialkyl ($C_8$-$C_{20}$) amines: (CAS 68526-63-6), alkyl ($C_{10}$-$C_{16}$)dimethyl amine (CAS 67700-98-5), alkyl ($C_{14}$-$C_{18}$) dimethyl amine (CAS 68037-93-4), dihydrogenated tallowmethyl amine (CAS 61788-63-4), and trialkyl ($C_6$-$C_{12}$) amines (CAS 68038-01-7). Illustrative but non-limiting examples of organic acid solvents that can be present in the nanoparticle paste formulations include, for example, octanoic acid, nonanoic acid, decanoic acid, caprylic acid, pelargonic acid, undecylic acid, lauric acid, tridecylic acid, myristic acid, pentadecanoic acid, palmitic acid, margaric acid, stearic acid, nonadecylic acid, α-linolenic acid, stearidonic acid, oleic acid, and linoleic acid.

In some embodiments, nanoparticle compositions described herein can include an organic matrix containing one or more organic solvents and a plurality of metal nanoparticles dispersed in the organic matrix, where the nanoparticle composition contains about 30% to about 90% metal nanoparticles by weight and the metal nanoparticles have a surfactant coating thereon that comprises one or more surfactants. The one or more organic solvents can include a hydrocarbon, an alcohol, an amine, and an organic acid.

In some embodiments, the organic matrix can include more than one hydrocarbon, more than one alcohol, more than one amine, and more than one organic acid. For example, in some embodiments, each class of organic solvent can have two or more members, or three or more members, or four or more members, or five or more members, or six or more members, or seven or more members, or eight or more members, or nine or more members, or ten or more members. Moreover, the number of members in each class of organic solvent can be the same or different. Particular benefits of using multiple members of each class of organic solvent are described hereinafter.

One particular advantage of using multiple members within each class of organic solvent can include the ability to provide a wide spread of boiling points in the nanoparticle compositions. By providing a wide spread of boiling points, the organic solvents can be removed gradually as the temperature is raised while affecting metal nanoparticle consolidation, thereby limiting volume contraction and disfavoring cracking. By gradually removing the organic solvent in this manner, less temperature control may be needed to affect slow solvent removal than if a single solvent with a narrow boiling point range was used. In some embodiments, the members within each class of organic solvent can have a window of boiling points ranging between about 50° C. and about 200° C. or between about 50° C. and about 250° C., or between about 100° C. and about 200° C., or between, about 100° C. and about 250° C. In more particular embodiments, the various members of each class of organic solvent can each have boiling points that are separated from one another by at least about 20° C. specifically about 20° C. to about 50° C. More specifically, in some embodiments, each hydrocarbon can have a boiling point that differs by about 20° C. to about 50° C. from other hydrocarbons in the organic matrix, each alcohol can have a boiling point that differs by about 20° C. to about 50° C. from other alcohols in the organic matrix, each amine can have a boiling point that differs by about 20° C. to about 50° C. from other amines in the organic matrix, and each organic acid can have a boiling point that differs by about 20° C. to about 50° C. from other organic acids in the organic matrix. As one of ordinary skill in the art will recognize, the more members of each class of organic solvent that are present, the smaller the differences between boiling points can be made. By having smaller differences between boiling points, solvent removal can be made more continual, thereby limiting the degree of volume contraction that occurs at each stage. When four to five or more members of each class of organic solvent are present (e.g., four or more hydrocarbons, four or more alcohols, four or more amines, and four or more organic acids; or five or more hydrocarbons, five or more alcohols, five or more amines, and five or more organic acids), each having boiling points that are separated from one another within the above range, the incidence of cracking can be particularly lessened. Moreover, by providing organic solvents with a range of boiling points, the risk of void formation during nanoparticle consolidation can also be lessened.

In addition to metal nanoparticles and organic solvents, other additives can also be present in the nanoparticle compositions. Such additional additives can include, for example, rheology control aids, thickening agents, micron-scale conductive additives, nanoscale conductive additives, and any combination thereof. Chemical additives can also be present. As discussed hereinafter, the inclusion of micron-scale conductive additives can be particularly advantageous.

In some embodiments, the micron-scale conductive additives can be micron-scale metal particles. In some embodiments, the nanoparticle compositions can contain about 0.01% to about 15% micron-scale metal, particles by weight, or about 1% to about 10% micron-scale metal particles by weight, or about 1% to about 5% micron-scale metal particles by weight. Inclusion of micron-scale metal particles, in the nanoparticle compositions can desirably reduce the incidence of cracking that occurs during consolidation of the metal nanoparticles. Without being bound by any theory or mechanism, it is believed that the micron-scale metal particles can become consolidated with one another as the metal nanoparticles are liquefied and flow between the micron-scale metal particles. In some embodiments, the micron-scale metal particles can range between about 500 nm to about 100 microns in size in at least one dimension, or from about 500 nm to about 10 microns in size in at least one dimension, or from about 100 nm to about 5 microns in size in at least one dimension, or from about 100 nm to about 10 microns in size in at least one dimension, or from about 100 nm to about 1 micron in size in at least one dimension, or from about 1 micron to about 10 microns in size in at least one dimension, or from about 5 microns to about 10 microns in size in at least one dimension, or from about 1 micron to about 100 microns in size in at least one dimension. The micron-size metal particles can contain the same metal as the metal nanoparticles or contain a different metal. Thus, metal alloys can be fabricated by including micron-size metal particles that differ from the metal nanoparticles in the nanoparticle paste formulations. Suitable micron-scale metal particles can include, for example, Cu, Ni, Al, Fe, Co, Mo, Ag, Zn, Sn, Au, Pd, Pt, Ru, Mn, Cr, Ti, V, Mg or Ca particles. Non-metal particles such as, for example, Si and B can be used in a like manner. In some embodiments, the micron-scale metal particles can be in the form of metal flakes, such as high aspect ratio copper flakes, for example. That is, in some embodiments, the nanoparticle paste formulations described herein can contain a mixture of copper nanoparticles and high aspect ratio copper flakes. Specifically, in some embodiments, the nanoparticle compositions can contain about 30% to about 90% copper nanoparticles by weight and about 0.01% to about 15% high aspect ratio copper flakes by weight. Other micron-scale metal particles that can be used equivalently to high aspect ratio metal flakes include, for example, metal nanowires and other high aspect ratio particles, which can be up to 300 microns in length.

In some embodiments, nanoscale conductive additives can also be present in the nanoparticle compositions. These additives can desirably provide further structural reinforcement and reduce shrinkage during metal nanoparticle consolidation. Moreover, inclusion of nanoscale conductive additives can increase electrical and thermal conductivity values that can approach or even exceed that of the corresponding bulk metal following nanoparticle consolidation. In some embodiments, the nanoscale conductive additives can have a size in at least one dimension ranging between about 1 micron and about 100 microns, or ranging between about 1 micron and about 300 microns. Suitable nanoscale conductive additives can include, for example, carbon nanotubes, graphene, and the like. When present, the nanoparticle compositions can contain about 1% to about 10% nanoscale conductive additives by weight, or about 1% to about 5% nanoscale conductive additives by weight. Additional substances that can also optionally be present include, for example, flame retardants, UV protective agents, antioxidants, carbon black, graphite, fiber materials (e.g., chopped carbon fiber materials), and the like.

As exemplified above, the nanoparticle compositions described herein can possess a high solids content. As used herein, the term "solids content" will refer to the total amount of solid material distributed in the organic matrix. Solid material in the organic matrix constituting the solids content of the nanoparticle compositions can include the metal nanoparticles and micron-scale metal particles, nanoscale conductive additives, and/or other solids, if present. As discussed above, by maintaining a high solids content, the nanoparticle compositions can desirably display a reduced, volume contraction, and decreased propensity toward cracking during metal nanoparticle consolidation. In some embodiments, the nanoparticle compositions can have a solids content ranging between about 30% to about 95% of the nanoparticle composition by volume, or between about 50% to about 90% of the nanoparticle nanoparticle composition by volume, or between about 70% to about 90% of the nanoparticle nanoparticle composition by volume, or between about 75% to about 90% of the nanoparticle nanoparticle composition by volume.

In various embodiments, methods for forming a metallic thermal interface layer between an electronic component and a metallic heat sink are described herein. In some embodiments, the methods include placing a composition containing a plurality of metal nanoparticles between a metallic heat sink and a heat-generating electronic component, heating the composition above a fusion temperature of the metal nanoparticles to liquefy the metal nanoparticles, and cooling the liquefied metal nanoparticles to form a metallic thermal interface layer between the heat-generating electronic component and the metallic heat sink. As discussed above, the metallic thermal interface layer includes metal nanoparticles that have been at least partially fused together with one another. In some embodiments, the composition can include at least copper nanoparticles. In some embodiments, at least some of the operations can take place under inert atmosphere or reduced pressure conditions.

In more specific embodiments, methods for forming a metallic thermal interface layer between a metallic heat sink and a heat-generating electronic component can include providing a metallic heat sink, disposing a composition including a plurality of metal nanoparticles on the metallic heat sink, and placing the heat-generating electronic component on the composition disposed on the metallic heat sink. Thereafter, the methods can further include heating the metal nanoparticles above their fusion temperature to liquefy the metal nanoparticles and then cooling the liquefied metal nanoparticles to form a metallic thermal interface layer in which the heat-generating electronic component is bonded to the metallic heat sink via the metallic thermal interface layer. The metallic thermal interface layer is formed in substantially the same locations where the metal nanoparticle composition is disposed, without flowing a liquefied metal. In alternative embodiments, the metal nanoparticles can become at least partially fused together with one another through application of pressure.

As discussed above, in some embodiments, the metallic heat sink can contain a passivating metal oxide surface layer thereon. A passivating metal oxide surface layer can particularly be present in copper alloy substrates, such as those used in conjunction with MMICs fabricated from GaN or SiC, for example. In some embodiments, the methods described herein can further include etching at least a portion of the passivating metal oxide surface layer with an etchant while heating the metal nanoparticle composition. It is believed that the etchant can react with the passivating metal oxide surface layer to form a reaction product that disperses in the remainder of the metal nanoparticle composition and does not substantially impact the properties of the metallic thermal interface layer formed therefrom upon nanoparticle fusion. Once the passivating metal oxide surface layer has been removed, liquefied metal nanoparticles can then contact the exposed surface of the metallic heat sink in order to establish a thermal connection to the heat-generating electronic component.

Although the disclosure has been described with reference to the above embodiments, one of ordinary skill in the art will readily appreciate that these only illustrative of the disclosure. It should be understood that various modifications can be made without departing from the spirit of the disclosure. The disclosure can be modified to incorporate any number of variations, alterations, substitutions or equivalent arrangements not heretofore described, but which are commensurate with the spirit and scope of the disclosure. Additionally, while various embodiments of the disclosure have been described. It is to be understood that aspects of the disclosure may include only some of the described embodiments. Accordingly, the disclosure is not to be seen as limited by the foregoing description.

What is claimed is the following:

1. A device assembly comprising:
a heat-generating electronic component in thermal communication with a metallic heat sink via a metallic thermal interface layer, the metallic thermal interface layer being disposed between the heat-generating electronic component and the metallic heat sink and the metallic thermal interface layer being formed from a composition comprising a plurality of metal nanoparticles that are at least partially fused together with one another.

2. The device assembly of claim 1, wherein the heat-generating electronic component comprises a monolithic microwave integrated circuit or a light-emitting diode.

3. The device assembly of claim 2, wherein the heat-generating electronic component comprises a monolithic microwave integrated circuit.

4. The device assembly of claim 3, wherein the monolithic microwave integrated circuit comprises a substrate comprising GaN or SiC.

5. The device assembly of claim 4, wherein a surface of the substrate adjacent to the metallic thermal interface layer is coated with a metal selected from the group consisting of copper, silver, gold, nickel, platinum, palladium, and any combination thereof.

6. The device assembly of claim 4, wherein the metallic heat sink comprises a copper alloy and the metal nanoparticles comprise copper nanoparticles.

7. The device assembly of claim 6, wherein the metallic heat sink comprises a passivating metal oxide surface layer and the composition further comprises an etchant capable of etching a metal oxide.

8. The device assembly of claim 7, wherein the etchant comprises abietic acid or an anhydride thereof.

9. The device assembly of claim 1, wherein the composition further comprises a plurality of diamond particles.

10. A method comprising:
placing a composition comprising a plurality of metal nanoparticles between a metallic heat sink and a heat-generating electronic component;
heating the composition above a fusion temperature of the metal nanoparticles to liquefy the metal nanoparticles; and
cooling the liquefied metal nanoparticles to form a metallic thermal interface layer between the heat-generating electronic component and the metallic heat sink, the metallic thermal interface layer comprising metal nanoparticles that have been at least partially fused together with one another.

11. The method of claim 10, wherein the heat-generating electronic component comprises a monolithic microwave integrated circuit or a light-emitting diode.

12. The method of claim 11, wherein the heat-generating electronic component comprises a monolithic microwave integrated circuit.

13. The method of claim 12, wherein the monolithic microwave integrated circuit comprises a substrate comprising GaN or SiC.

14. The method of claim 13, wherein a surface of the substrate adjacent to the metallic thermal interface layer is coated with a metal selected from the group consisting of copper, silver, gold, and any combination thereof.

15. The method of claim 13, wherein the metallic heat sink comprises a copper alloy and the metal nanoparticles comprise copper nanoparticles.

16. The method of claim 15, wherein the metallic heat sink comprises a passivating metal oxide surface layer and the composition further comprises an etchant capable of etching a metal oxide, the method further comprising etching at least a portion of the passivating metal oxide surface layer while heating the composition.

17. The method of claim 16, wherein the etchant comprises abietic acid or an anhydride thereof.

18. The method of claim 10, wherein the composition further comprises diamond particles.

19. The method of claim 10, wherein the metallic heat sink comprises a passivating metal oxide surface layer and the composition further comprises an etchant capable of etching a metal oxide, the method further comprising etching at least a portion of the passivating metal oxide surface layer while heating the composition.

20. The method of claim 19, wherein the etchant comprises abietic acid or an anhydride thereof.

* * * * *